United States Patent
Nagura

[11] Patent Number: 5,965,928
[45] Date of Patent: Oct. 12, 1999

[54] SEMICONDUCTOR DEVICE WITH MOS CAPACITOR AND FABRICATION METHOD THEREOF

[75] Inventor: Nobuhiro Nagura, Tokyo, Japan

[73] Assignee: NEC Corporation, Toyko, Japan

[21] Appl. No.: 08/837,393

[22] Filed: Apr. 17, 1997

[30] Foreign Application Priority Data

Apr. 17, 1996 [JP] Japan ................................. 8-095718

[51] Int. Cl.[6] .............................................. H01L 29/94
[52] U.S. Cl. ...................... 257/532; 257/296; 257/299; 257/313
[58] Field of Search .................................. 257/532, 296, 257/299, 313

[56] References Cited

U.S. PATENT DOCUMENTS

| | | | |
|---|---|---|---|
| 4,245,231 | 1/1981 | Davies | 357/51 |
| 4,816,894 | 3/1989 | Hattori | 357/51 |
| 5,360,989 | 11/1994 | Endo | 257/532 |
| 5,608,258 | 3/1997 | Rajkanan et al. | 257/532 |

FOREIGN PATENT DOCUMENTS 2-137256  5/1990  Japan .

*Primary Examiner*—Valencia Martin-Wallace
*Attorney, Agent, or Firm*—Sughrue, Mion, Zinn Macpeak & Seas, PLLC

[57] ABSTRACT

A semiconductor device is provided, which is able to suppress the capacitance lowering of the capacitor due to a voltage applied across the capacitor. The device includes a well formed in a semiconductor substrate of a first conductivity type. The well is of a second conductivity type opposite to the first conductivity type. A surface area of the well is divided into at least first and second parts. The first part is of the first conductivity type and the second part is of the second conductivity type. An insulating layer is formed on the well to be contacted with the first and second parts. An electrode is formed on the insulating layer and is located over the first and second parts. The capacitor formed by the well, the insulating layer, and the electrode is equivalent to a capacitor composed by a first subcapacitor including the first part and a second subcapacitor including the second part. The dopant concentration of the first and second parts of the well may be higher or lower than that of the remaining well.

11 Claims, 14 Drawing Sheets

SEMICONDUCTOR DEVICE WITH MOS CAPACITOR AND FABRICATION METHOD THEREOF

BACKGROUND OF THE INVENTION

1. Field of the Invention

The present invention relates to a semiconductor device and more particularly, to a semiconductor device with a so-called Metal-Oxide-Semiconductor (MOS) capacitor, and a fabrication method thereof.

2. Description of the Prior Art

Conventionally, a MOS capacitor has been used as one of the electronic components in a semiconductor device.

It is needless to say that a plurality of active areas are defined on a main surface of a semiconductor substrate and a plurality of MOS capacitors are formed in the plurality of active areas. However, only one of the plurality of active areas and only one of the capacitors are explained in this specification for the sake of simplification of description.

A typical example of the conventional semiconductor devices with MOS capacitors is shown in FIGS. 1A to 1E.

First, as shown in FIG. 1A, a patterned photoresist film 102 with a window 102a is formed on a main surface of a p-type semiconductor substrate 101. The window 102a typically has a square or rectangular plan shape.

Next, using the patterned photoresist film 102 as a mask, phosphorus (P) ions are selectively implanted into the substrate 101 through the window 102a of the film 102 with a dose of approximately $1\times10^{12}$ to $1\times10^{14}$ atoms/cm$^2$. The bottom of the ion-implanted region is indicated by the reference numeral 103 in FIG. 1A.

After the photoresist film 102 is stripped, the substrate 101 is subjected to a heat treatment at a temperature of 1000° C. or higher to diffuse the implanted phosphorus ions within the substrate 101, thereby forming an n-type well 104, as shown in FIG. 1B. The well 104 typically has a square or rectangular plan shape.

Subsequently, a silicon nitride (SiN$_x$) layer 105 with a thickness of approximately 50 to 1000 nm is grown on the well 104 by a Chemical Vapor Deposition (CVD) process or the like. The layer 105 is then patterned to have a specific plan shape such as a square or rectangle by popular patterning processes, as shown in FIG. 1B.

Using the patterned silicon nitride layer 105 as a mask, the substrate 101 is thermally oxidized to selectively grow a field oxide layer 106 at a location where the silicon nitride layer 105 is removed, as shown in FIG. 1C. Thus, an active area 107 is defined by the field oxide layer 106 on the main surface of the substrate 101. The field oxide layer 106 is located on the periphery of the n-type well 104.

After stripping the patterned silicon nitride layer 105, an insulating layer 108 with a thickness of approximately 1 to 100 nm is formed on the whole, exposed surface of the well 104 or the active area 107. This insulating layer 108 is formed simultaneously with the formation process of a gate insulating layer for MOS Field-Effect Transistors (MOSFETs) (not shown) to be provided on the same substrate 101.

A conductive layer (not shown) with a thickness of approximately 100 to 1000 nm is grown over the whole substrate 101 by a CVD process or the like, and then, is patterned to form an electrode 109 on the insulating layer 108, as shown in FIG. 1C. This conductive layer is formed simultaneously with the formation process of gate electrodes for the MOSFETs to be provided on the same substrate 101.

The insulating layer 108 is partially exposed from the electrode 109, as shown in FIG. 1C.

Subsequently, using the electrode 109 as a mask, phosphorus (P) or arsenic (As) ions are selectively implanted into the well 104 through the gap between the electrode 109 and the field oxide layer 106 with a dose of approximately $1\times10^{14}$ to $1\times10^{16}$ atoms/cm$^2$. The bottom of the implanted region are indicated by the reference numeral 110 in FIG. 1D.

Further, the substrate 101 is subjected to a heat treatment at a temperature of 800° C. or higher to activate the implanted ions within the well 104, thereby forming an n$^+$-type diffusion region 111 to surround the electrode 109, as shown in FIG. 1E.

Through the above-described process steps, the conventional semiconductor device with the MOS capacitor is obtained. The MOS capacitor is composed of the n-type well 104, the insulating layer 108, and the electrode 109. The n$^+$-type diffusion region 111 serves as a contact region for electrical connection to the n-type well layer 104.

With the above-described conventional MOS capacitor, the n-type well 104 and the electrode 109 serve as a pair of electrodes of the capacitor and the insulating layer 10B serves as a dielectric thereof. The n$^+$-type diffusion region 111 serves as a contact region for electrical connection.

The conventional semiconductor device as shown in FIG. 1E has a problem that the capacitance of the MOS capacitor may decrease when the electric potential difference between the n-type well 104 and the electrode 109 satisfies a specific condition.

Specifically, when the electric potential of the electrode 109 is lower than that of the n-type well 104, i.e., a backward voltage is applied across the MOS capacitor, a weak inversion region will be formed on the surface of the well 104. When the electric potential of the electrode 109 is further lowered, the weak inversion region will be a strong inversion region.

The weak or strong inversion region causes a depletion region and a channel region in the surface area of the well 104. As a result, a capacitor is formed by the well 104, the depletion region, and the channel region and at the same time, another capacitor is formed by the channel region, the insulating layer 108, and the electrode 109. These two capacitors are electrically connected in cascade. Therefore, the total capacitance of the MOS capacitor is decreased to approximately (½) to (⅕) of the normal capacitance where no weak nor strong inversion region are formed.

Accordingly, considering the above capacitance decrease due to the formation of the weak or strong inversion region, it is necessary that the MOS capacitor is designed to have a larger size than that for the required capacitance. This means that the chip area of the MOS capacitor increases, resulting in lowering of the device integration density.

To solve the above problem about the capacitance decrease, the Japanese Non-Examined Patent Publication No. 2-137256 published in May 1990 disclosed an improved structure of the MOS capacitor.

In the conventional, improved structure of the Japanese Non-Examined Patent Publication No. 2-137256, first and second MOS capacitors having the same structure are provided on a semiconductor substrate. The first and second capacitors are electrically connected to each other to be opposite polarities or directions.

With the improved structure of the Japanese Non-Examined Patent Publication No. 2-137256, however, the first and second capacitors need to be located at a comparatively large lateral distance in order to prevent the latch-up phenomenon. This also results in decrease of the device integration density.

SUMMARY OF THE INVENTION

Accordingly, an object of the present invention is to provide a semiconductor device with a capacitor that is able to suppress the capacitance lowering of the capacitor due to a voltage applied across the capacitor, and a fabrication method of the device.

Another object of the present invention is to provide a semiconductor device with a capacitor that is able to cope with further device integration, and a fabrication method of the device.

There objects together with others not specifically mentioned will become clear to those skilled in the art from the following description.

According to a first aspect of the present invention, a semiconductor device is provided, which includes a well formed in a semiconductor substrate of a first conductivity type. The well is of a second conductivity type opposite to the first conductivity type.

A surface area of the well is divided into at least first and second parts. The first part is of the first conductivity type and the second part is of the second conductivity type.

An insulating layer is formed on the well to be contacted with the first and second parts.

An electrode is formed on the insulating layer and is located over the first and second parts.

With the semiconductor device according to the first aspect of the invention, the surface area of the well is divided into at least the first part of the first conductivity type and the second part of the second conductivity type. Therefore, the capacitor formed by the well, the insulating layer, and the electrode comprises a first subcapacitor including the first part and a second subcapacitor including the second part.

Since the conductivity type of the first and second parts are opposite to each other, the capacitance of the first subcapacitor increases and the capacitance of the second subcapacitor decreases with an increasing voltage applied across the capacitor.

As a result, the capacitance lowering of the capacitor due to the voltage applied across the capacitor can be suppressed.

Further, as the capacitance lowering of the capacitor due to the voltage is suppressed, there is no need that the capacitor is designed to have a larger size than that for the required capacitance. This means that the chip area of the capacitor does not increase.

Consequently, the semiconductor device according to the first aspect is able to cope with further device integration.

In a preferred embodiment of the semiconductor device according to the first aspect, the dopant concentration of the first and second parts of the well is higher than that of the remaining well.

In this case, there is an additional advantage that the voltage dependence of the capacitance is further suppressed.

In another preferred embodiment of the semiconductor device according to the first aspect, the dopant concentration of the first and second parts of the well is lower than that of the remaining well.

In this case, it is preferred that the surface area of the well further includes a third part of the first conductivity type and a fourth part of the second conductivity type for electrical connection to the well.

In still another preferred embodiment of the semiconductor device according to the first aspect, the first and second parts of the well have a same plan size.

In this case, an advantage that the voltage dependence of the capacitance is symmetric with respect to the applied voltage occurs.

According to a second aspect of the present invention, a fabrication method of the semiconductor device according to the first aspect is provided.

The method is comprised of the following steps:

(a) A semiconductor substrate of a first conductivity type is prepared.

(b) A well of a second conductivity type is formed in the substrate. The second conductivity type is opposite to the first conductivity type.

(c) A first masking layer is formed on the well to cover a specific area of the well.

(d) A first dopant of the first conductivity type is selectively ion-implanted into a surface area of the well using the first masking layer, thereby forming a first part of the first conductivity type in the surface area.

(e) The first masking layer is removed.

(f) A second masking layer is formed on the well to cover the remaining area of the well.

(g) A second dopant of the second conductivity type is selectively ion-implanted into the surface area of the well using the second masking layer, thereby forming a second part of the second conductivity type in the surface area.

(h) The second masking layer is removed.

(i) An insulating layer is formed on the well region to be contacted with the first and second parts of the surface area of the well.

(j) An electrode is formed on the insulating layer to be located over the first and second parts.

The well, the insulating layer, and the electrode constitute a capacitor.

With the fabrication method according to the second aspect of the present invention, the semiconductor device according to the first aspect can be fabricated.

In a preferred embodiment of the method according to the second aspect, the doses of the ion-implantation steps (d) and (g) are set in such a way that the dopant concentration of the first and second parts of the well is higher than that of the remaining well.

In another preferred embodiment of the method according to the second aspect, the dose of the ion-implantation steps (d) and (g) are set in such a way that the dopant concentration of the first and second parts of the well is lower than that of the remaining well.

In still another preferred embodiment of the method according to the second aspect, the first masking layer is formed to cover a half of the well in the step (c), and the second masking layer is formed to cover another half thereof in the step (f).

In a further preferred embodiment of the method according to the second aspect, a step of forming a third part of the first conductivity type in the surface area of the well and a step of forming a fourth part of the second conductivity type in the surface area of the well are further provided for electrical connection to the well.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1A:
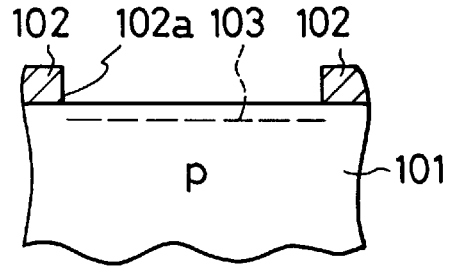
FIGS. 1A to 1E are partial, cross-sectional views of a conventional semiconductor device, which show a fabrication method of the device, respectively.
Figure 1B:
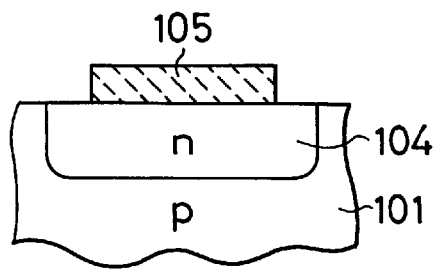
Figure 1C:
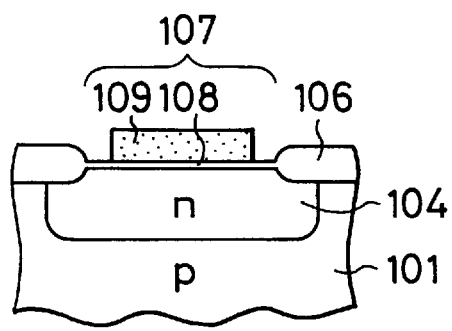
Figure 1D:
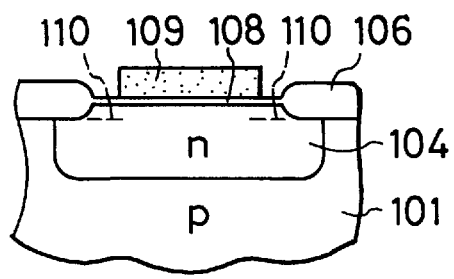
Figure 1E:
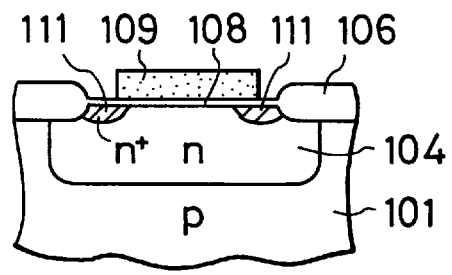

Preferred embodiments of the present invention will be described in detail below while referring to the drawings attached.

FIRST EMBODIMENT

Figure 2:
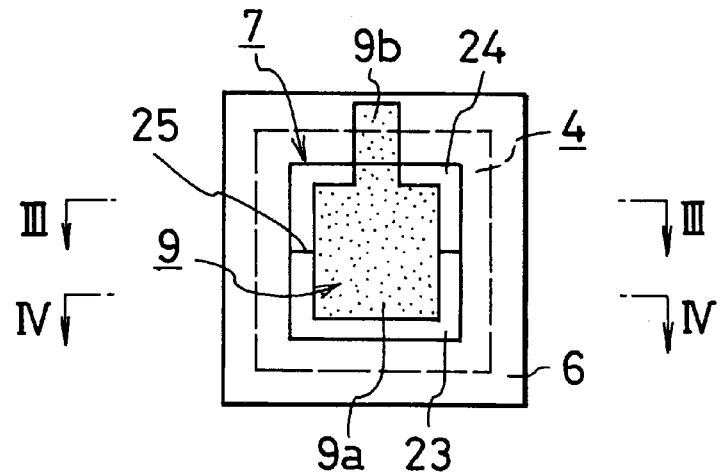
FIG. 2 is a partial, plan view of a semiconductor device according to a first embodiment of the present invention, where the insulating layer formed on the well is omitted.
Figure 3:
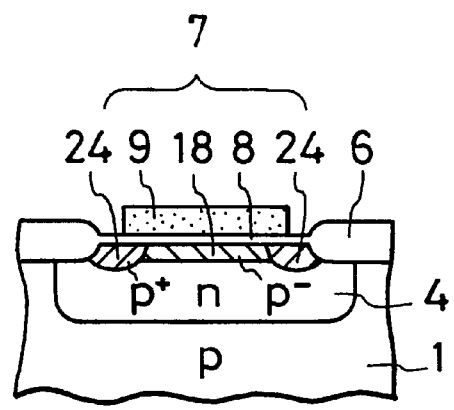
FIG. 3 is a partial, cross-sectional view along the line III—III in FIG. 2.
Figure 4:
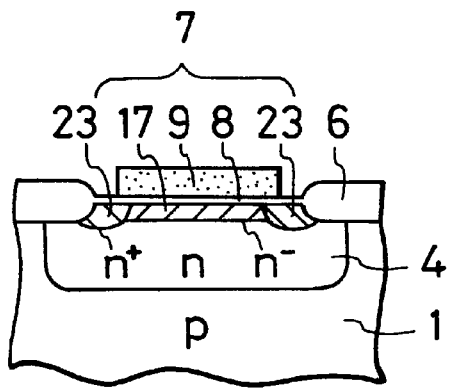
FIG. 4 is a partial, cross-sectional view along the line IV—IV in FIG. 2.

As shown in FIGS. 2, 3, and 4, in a semiconductor device according to a first embodiment, a patterned field oxide layer 6 is formed on a main surface of a p-type single-crystal silicon substrate 1, defining an active area 7 on the substrate 1. The active area 7 has a square plan shape.

An n-type well 4 is formed in the substrate 1. The well 4 has a square plan shape larger than that of the active area 7. The periphery of the well 4 is located under the field oxide layer 6.

As clearly shown in FIGS. 3 and 4, an $n^-$-type diffusion region 17 with a rectangular plan shape, a $p^-$-type diffusion region 18 with a rectangular plan shape, an $n^+$-type diffusion region 23 with a U-type plan shape, and a $p^+$-type diffusion region 24 with a U-type plan shape are formed in a surface area of the well 4.

The $n^-$-type diffusion region 17 has a dopant concentration lower than that of the remaining well 4. The $n^+$-type diffusion region 23 has a dopant concentration higher than that of the remaining well 4.

Similarly, the $p^-$-type diffusion region 18 has a dopant concentration lower than that of the substrate 1. The $p^+$-type diffusion region 24 has a dopant concentration higher than that of the substrate 1.

The $n^-$-type diffusion region 17 and the $n^+$-type diffusion region 23 are located in a half (a lower half in FIG. 2) of the surface area of the well 4. The $p^-$-type diffusion region 18 and the $p^+$-type diffusion region 24 are located in another half (an upper half in FIG. 2) of the surface area of the well 4. In other words, the surface area of the n-type well 4 is divided into the four diffusion regions 17, 23, 16, and 24.

The $n^-$-type diffusion region 17 and the $p^-$-type diffusion region 18 serve as parts of first and second subcapacitors, respectively. The $n^+$-type diffusion region 23 and the $p^+$-type diffusion region 24 serve as contacts for electrical connection to the n-type well 4.

The reference numeral 25 in FIG. 2 indicates the boundary of the two halves. The boundary 25 separates the combination of the $n^-$-type diffusion region 17 and the $n^+$-type diffusion region 23 from the combination of the $p^-$-type diffusion region 18 and the $p^+$-type diffusion region 24.

An insulating layer 8 is formed on the whole, exposed surface of the active region 7 or the well 4. The layer 8 is omitted in FIG. 2 for the sake of facilitation in understanding.

The insulating layer 8 is contacted with the underlying surface area of the well 4. In other words, the insulating layer 8 is contacted with the $n^-$-type diffusion region 17, the $p^-$-type diffusion region 18, the $n^+$-type diffusion region 23, and the $p^+$-type diffusion region 24.

An electrode 9 is formed on the insulating layer 8. The electrode 9 is formed by two parts 9a and 9b. The part 9a is of a square plan shape and located on the insulating layer 8 in the active area 7. The part 9b is of a rectangular plan shape and is laterally protruded from the part 9a.

The whole $n^-$-type diffusion region 17 and the whole $p^-$-type diffusion region 18 are positioned under the part 9a of the electrode 9. The $n^+$-type diffusion region 23 and the $p^+$-type diffusion region 24 are formed to link the $n^-$-type diffusion region 17 and the whole $p^-$-type diffusion region 18 with the field oxide layer 6. In other words, the $n^+$-type diffusion region 23 and the $p^+$-type diffusion region 24 are located underneath a square-ringed gap formed between the electrode 9 and the field oxide layer 6 on the insulating layer 8.

The depth of the n⁻-type diffusion region 17 is substantially the same as that of the p⁻-type diffusion region 18. The depth of the n⁺-type diffusion region 23 is substantially the same as that of the p⁺-type diffusion region 24. The depth of the n⁺-type diffusion region 17 and the p⁻-type diffusion region 18 are smaller than that of the n⁺-type diffusion region 23 and the p⁺-type diffusion region 24.

The first subcapacitor is formed by the n⁻-type diffusion region 17, an opposing part of the well 4 to the region 17, an opposing part of the insulating layer 6 to the region 17, and an opposing part of the electrode 9 to the region 17. The second subcapacitor is formed by the p⁻-type diffusion region 18, an opposing part of the well 4 to the region 18, an opposing part of the insulating layer 6 to the region 18, and an opposing part of the electrode 9 to the region 18.

The first and second subcapacitors constitute a bidirectional MOS capacitor formed by the n-type well 4, the insulating layer 8, and the electrode 9.

Next, a fabrication method of the semiconductor device according to the first embodiment of FIGS. 2, 3, and 4 is explained below with reference to FIGS. 5A to 5G, 6A to 6G, and 7A to 7G.

Figure 5A:
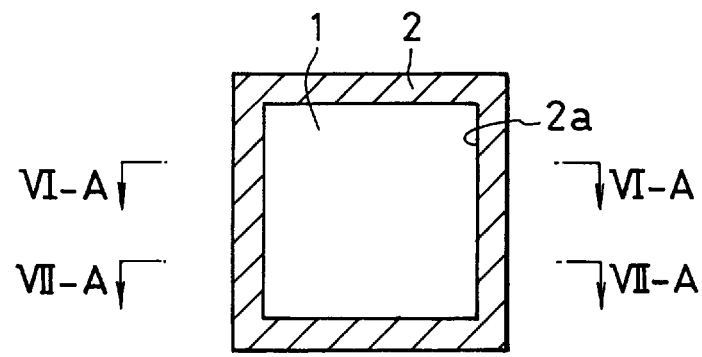
FIGS. 5A to 5G are partial, plan views of the semiconductor device, which show a fabrication method of the semiconductor device according to the first embodiment of FIGS. 2, 3, and 4, respectively.
Figure 6A:
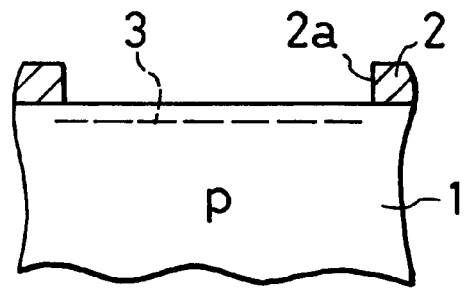
FIGS. 6A to 6G are partial, cross-sectional views along the lines VI-A-VI-A to VI-G-VI-G in FIGS. 5A to 5G, which show the fabrication method of the semiconductor device according to the first embodiment of FIGS. 2, 3, and 4, respectively.
Figure 7A:
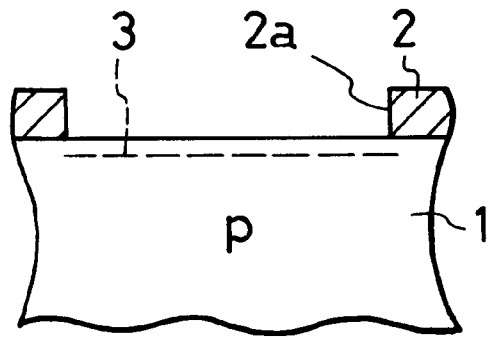
FIGS. 7A to 7G are partial, cross-sectional views along the lines VII-A-VII-A to VII-G-VII-G in FIGS. 5A to 5G, which show the fabrication method of the semiconductor device according to the first embodiment of FIGS. 2, 3, and 4, respectively.

First, as shown in FIGS. 5A, 6A, and 7A, a patterned photoresist film 2 with a square window 2a is formed on the main surface of the p-type single-crystal silicon substrate 1. Next, using the photoresist film 2 as a mask, phosphorus (P) ions are selectively implanted into the substrate 1 through the window 2a of the film 2 with a dose of approximately $1 \times 10^{12}$ to $1 \times 10^{14}$ atoms/cm². The bottom of the ion-implanted region is indicated by the reference numeral 3 in FIGS. 6A and 7A.

Figure 5B:
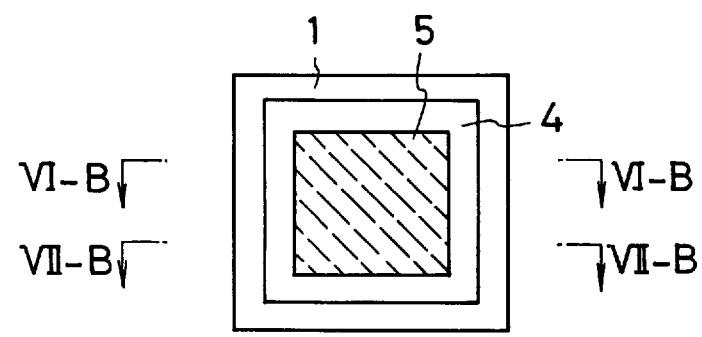
Figure 6B:
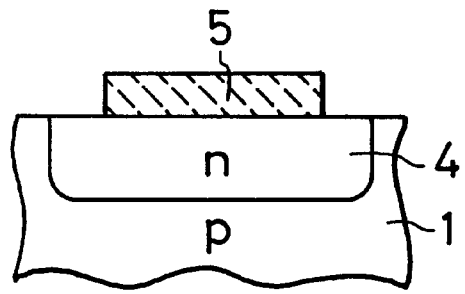
Figure 7B:
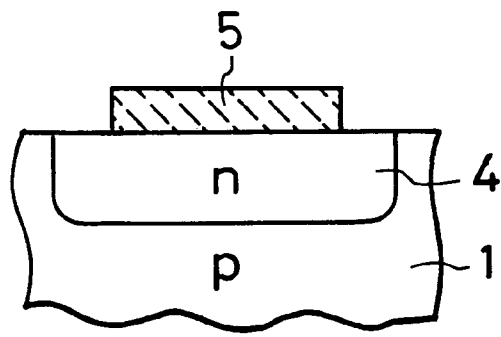

After the photoresist film 2 is stripped, the substrate 1 is subjected to a heat treatment at a temperature of 1000° C. or higher to diffuse the implanted phosphorus ions within the substrate 1, thereby forming the n-type well 4, as shown in FIGS. 5B, 6B, and 7B.

It is needless to say that a high-energy ion-implantation method may be used for this ion-implantation process.

Then, a silicon nitride layer 5 with a thickness of approximately 50 to 1000 nm is grown on the well 4 by a CVD process or the like, and then, the layer 5 is patterned to be located on the well 4 by popular patterning processes, as shown in FIGS. 5B, 6B, and 7B. The silicon nitride layer 5 has a square plan shape smaller than the window 2a of the photoresist film 2, and is concentric with the well 4. The state at this stage is shown in FIGS. 5B, 6B, and 7B.

Figure 5C:
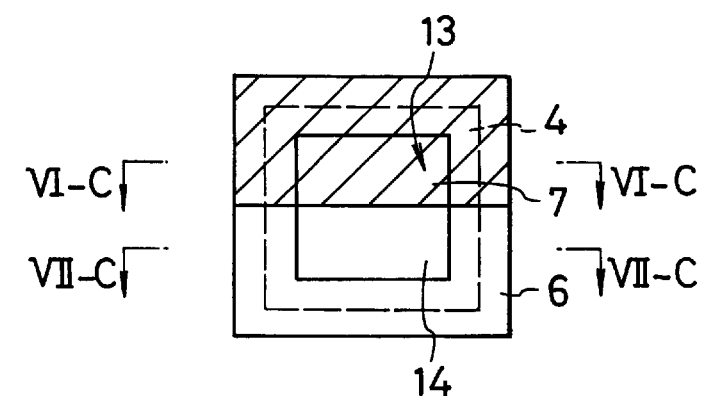
Figure 6C:
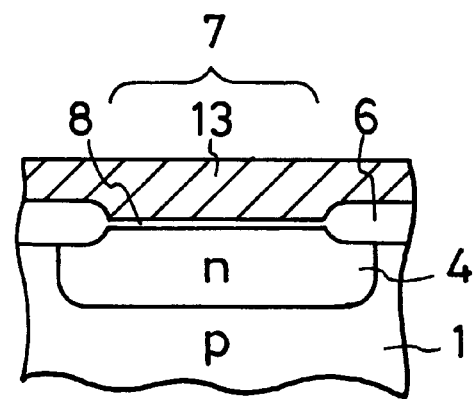
Figure 7C:
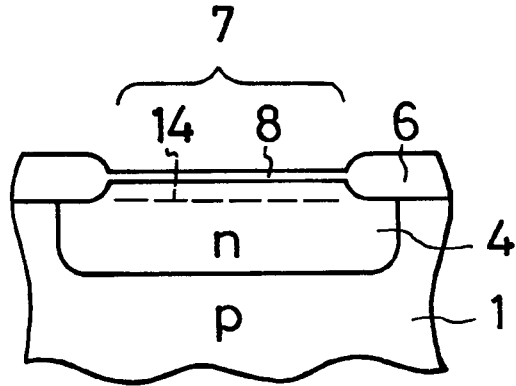

Using the patterned silicon nitride layer 5 as a mask, the substrate 1 is thermally oxidized at a temperature of 900° C. or higher, selectively growing a field oxide layer 6 at a location where the nitride layer 5 has been removed. Thus, the square active area 7 is defined by the field oxide layer 6 on the n-type well 4, as shown in FIGS. 5C, 6C, and 7C. The whole active area 7 is positioned in the well 4. The periphery of the well 4 is located under the field oxide layer 6.

After stripping the remaining silicon nitride layer 5, an insulating layer 6 with a thickness of approximately 1 to 100 nm is formed on the exposed surface of the well 4 or the active area 7, as shown in FIGS. 6C, and 7C by a popular process. This process is performed in a gate-oxide formation process for MOSFETs (not shown) provided on the substrate 1.

Subsequently, as shown in FIGS. 5C, 6C, and 7C, a patterned photoresist film 13 is formed on the insulating layer 8. The film 13 covers not only a half (an upper half in FIG. 5C) of the well 4 but also the field oxide layer 6. Using the photoresist film 13 as a mask, phosphorus (P) or arsenic (As) ions as an n-type dopant are selectively implanted into the well 4 with a dose of approximately $1 \times 10^{12}$ to $1 \times 10^{14}$ atoms/cm². The implanted region is indicated by the reference numeral 14 in FIG. 5C.

Figure 5D:
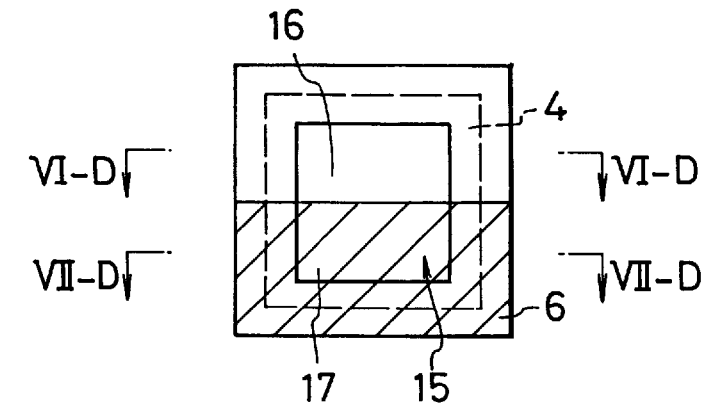
Figure 6D:
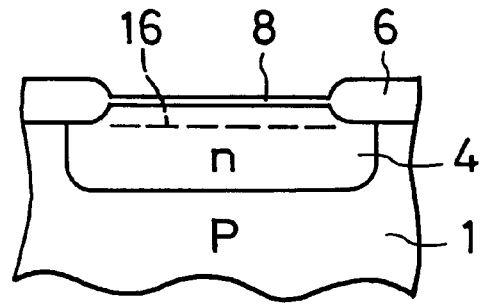
Figure 7D:
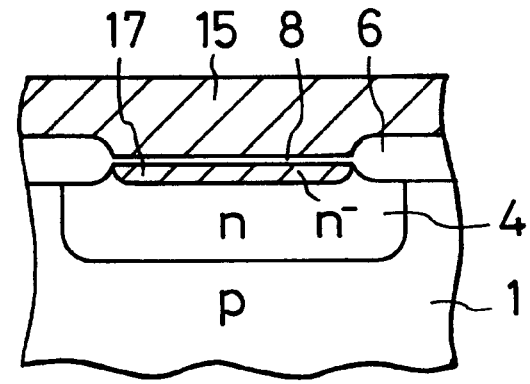

After stripping the photoresist film 13, a patterned photoresist film 15 is formed on the insulating layer 8, as shown in FIGS. 5D, 6D, and 7D. The layer 14 covers not only another half (a lower half in FIG. 5D) of the well 4 but also the field oxide layer 6. Using the photoresist film 15 as a mask, boron (B) or boron fluoride (BF₂) ions as a p-type dopant are selectively implanted into the well 4 with a dose of approximately $1 \times 10^{12}$ to $1 \times 10^{14}$ atoms/cm². The implanted region is indicated by the reference numeral 16 in FIG. 5D.

Figure 5E:
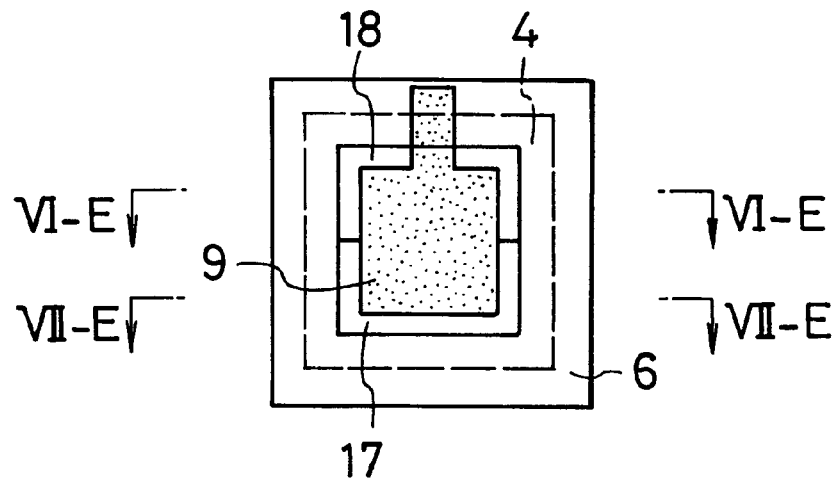
Figure 5F:
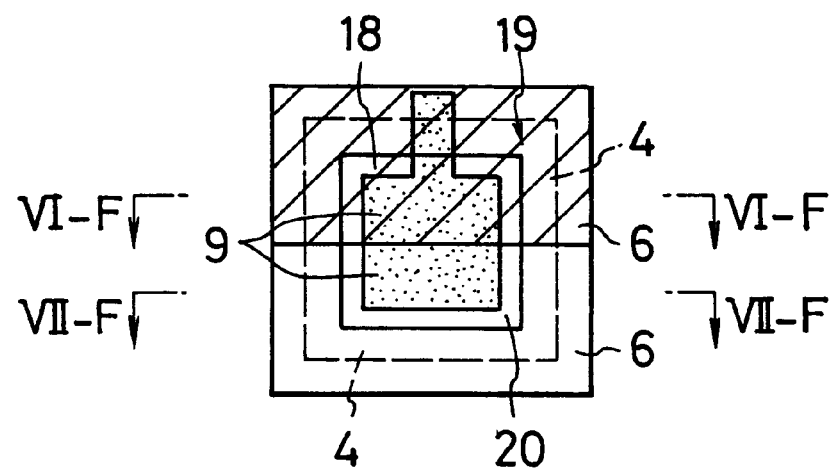
Figure 5G:
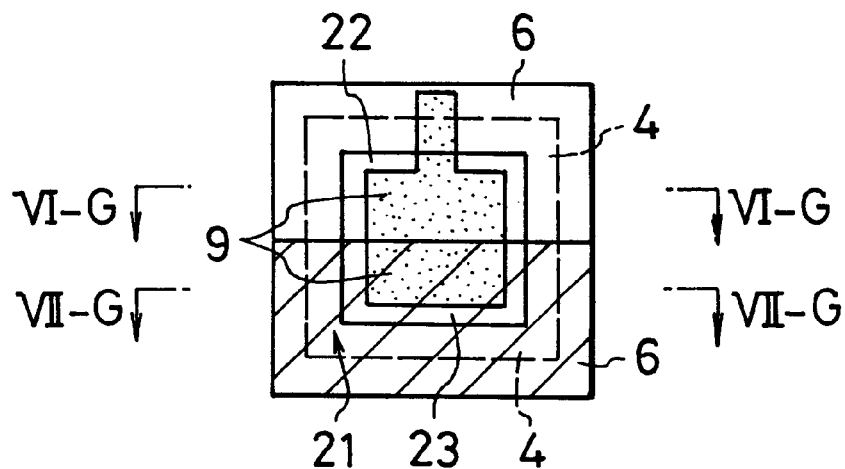
Figure 6E:
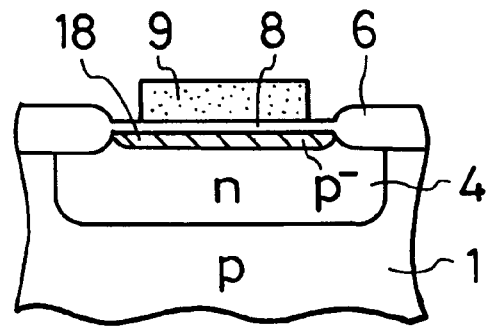
Figure 6F:
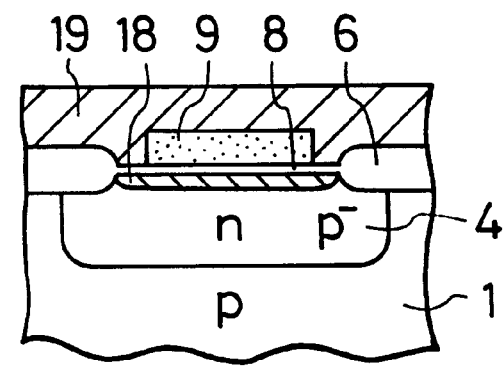
Figure 6G:
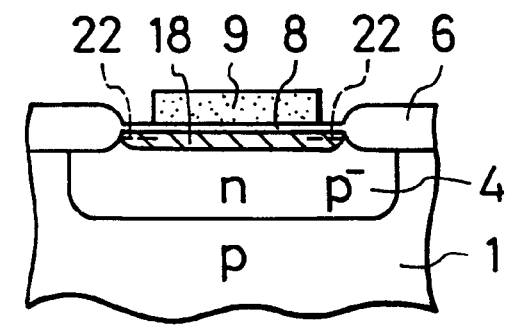
Figure 7E:
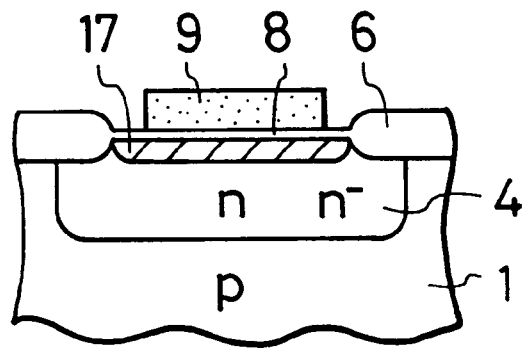
Figure 7F:
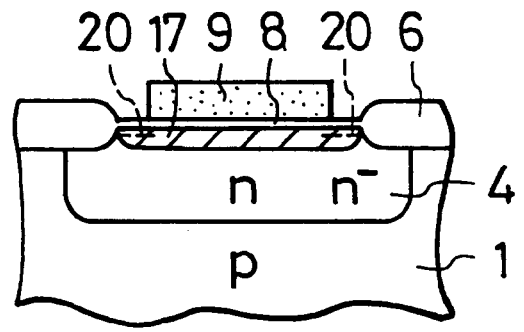
Figure 7G:
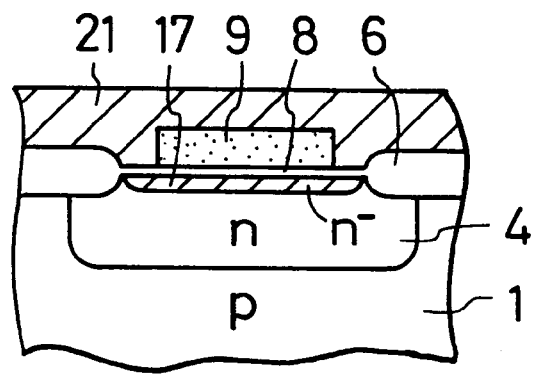

Following this step, the substrate 1 is subjected to a heat treatment at a temperature of 800° C. or higher to activate the implanted ions within the well 4, thereby forming an n⁻-type diffusion region 17 in a half of the surface area of the well 4 and a p⁻-type diffusion region 18 in another half thereof, as shown in FIGS. 5E, 6E, and 7E.

A conductive layer with a thickness of approximately 100 to 1000 nm is formed on the whole substrate 1 and then, is patterned to form an electrode 9 on the insulating layer 8. The insulating layer 8 is exposed from the electrode 9 through the gap, as shown in FIGS. 5E, 6E, and 7E.

Further, a patterned photoresist film 19 is formed on the electrode 9, the exposed insulating layer 8, and the field oxide layer 6. The layer 19 covers not only a half (an upper half in FIG. 5F) of the well 4 but also the field oxide layer 6. Using the photoresist film 19 and the electrode 9 as a mask, phosphorus or arsenic ions are selectively implanted into the well 4 with a dose of approximately $1 \times 10^{14}$ to $1 \times 10^{16}$ atoms/cm². The implanted region is indicated by the reference numeral 20 in FIG. 5F.

After stripping the photoresist film 19, a patterned photoresist film 21 is formed on the electrode 9, the exposed insulating layer 8, and the field oxide layer 6. The layer 21 covers not only another half (a lower half in FIG. 5G) of the well 4 but also the field oxide layer 6. Using the photoresist film 21 and the electrode 9 as a mask, boron ions or boron fluoride ions are selectively implanted into the well 4 with a dose of approximately $1 \times 10^{12}$ to $1 \times 10^{14}$ atoms/cm². The implanted region is indicated by the reference numeral 22 in FIG. 5G.

After stripping the photoresist film 21, the substrate 1 is then subjected to a heat treatment at a temperature of 800 ° C. or higher to activate the implanted ions within the well 4, thereby forming the n⁺-type diffusion region 23 and the p⁺-type diffusion region 24, as shown in FIGS. 2, 3, and 4.

Through the above-described process steps, the MOS capacitor is formed on the substrate 1.

With the semiconductor device according to the first embodiment of FIGS. 2, 3, and 4, the surface area of the well 4 is divided into the n⁻-type diffusion region 17, the p⁻-type diffusion region 18, the n⁺-type diffusion region 23, and the p⁺-type diffusion region 24.

Since the conductivity type of the regions 17 and 23 are opposite to that of the regions 18 and 24, the capacitance of the first subcapacitor increases and the capacitance of the second subcapacitor decreases with an increasing voltage applied across the capacitor.

As a result, the capacitance lowering of the capacitor due to the voltage applied across the capacitor can be suppressed.

Further, as the capacitance lowering of the capacitor due to the voltage is suppressed, there is no need that the capacitor is designed to have a larger size than that for the required capacitance. This means that the chip area of the capacitor does not increase.

Consequently, the semiconductor device according to the first embodiment is able to cope with further device integration.

Figure 8:
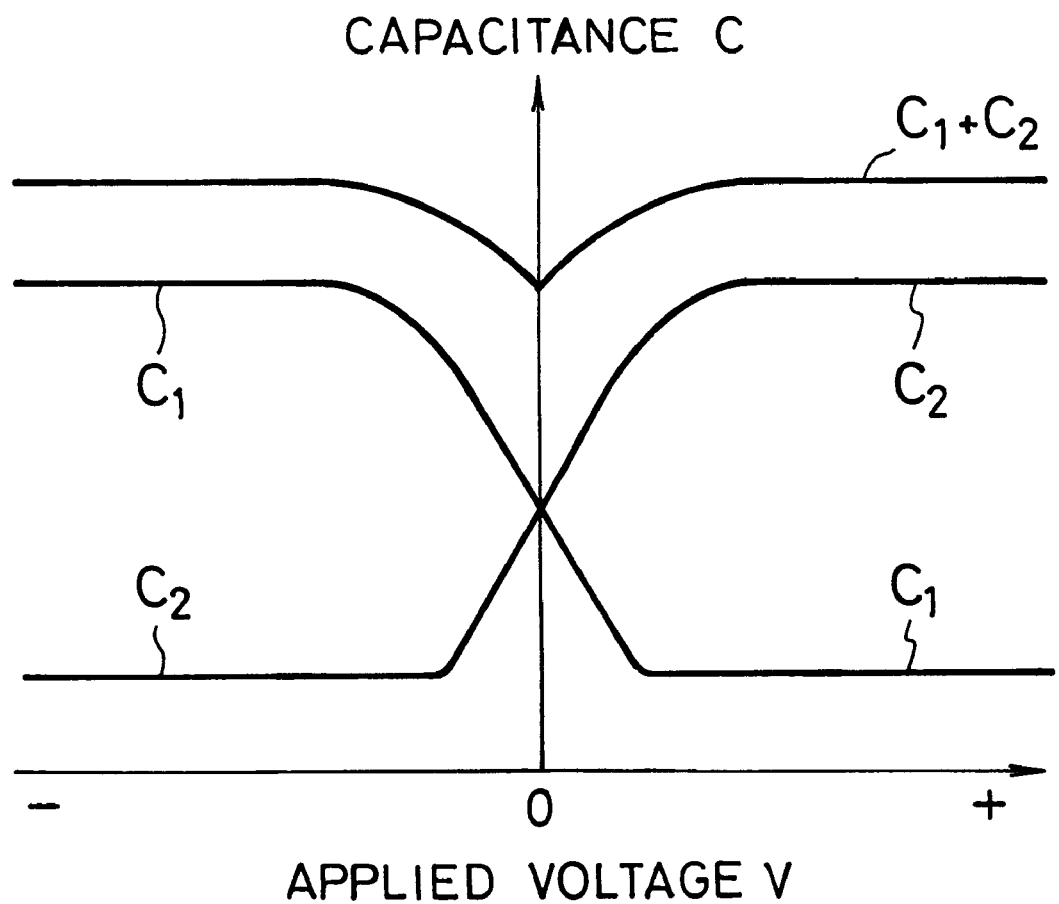
FIG. 8 is a graph showing the voltage (V)-capacitance (C) characteristics of the capacitor and its first and second subcapacitors in the semiconductor device according to the first embodiment of FIGS. 2, 3, and 4.

FIG. 8 shows the V-C characteristics of the first and second subcapacitors in the semiconductor device according to the first embodiment of FIGS. 2, 3, and 4. In FIG. 8, the curve $C_1$ indicates the V-C characteristic of the subcapacitor including the $p^-$-type diffusion region 18, and the curve $C_2$ indicates the V-C characteristic of the subcapacitor including the $n^-$-type diffusion region 17.

It is seen from the curves $C_1$ and $C_2$ that the first and second subcapacitors have opposite V-C characteristics, and the sum of the two characteristics is expressed by a curve $(C_1+C_2)$.

As shown by the curve $(C_1+C_2)$, the C-V characteristic of the capacitor of the semiconductor device is approximately flat, and consequently, the capacitance change of the capacitor due to the applied voltage V is able to be suppressed.

The obtainable total capacitance of the two subcapacitors can be adjusted by changing the dose or dopant concentration of the diffusion regions 17 and 18.

SECOND EMBODIMENT

Figure 9:
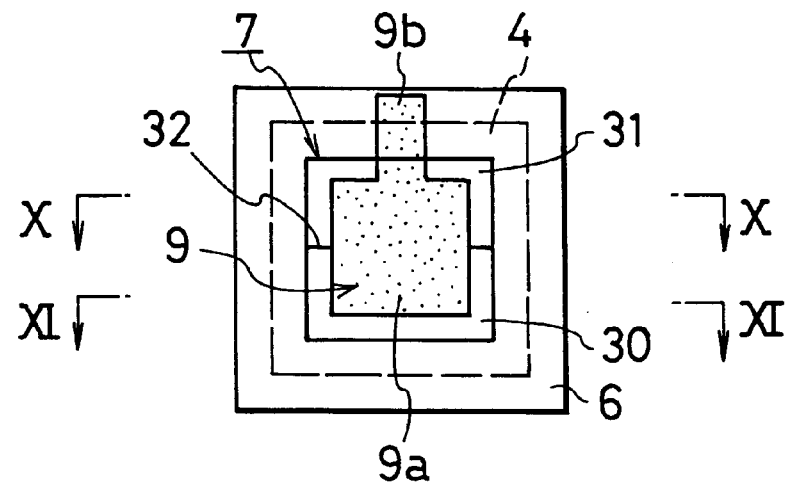
FIG. 9 is a partial, plan view of a semiconductor device according to a second embodiment of the present invention, where the insulating layer formed on the well is omitted.
Figure 10:
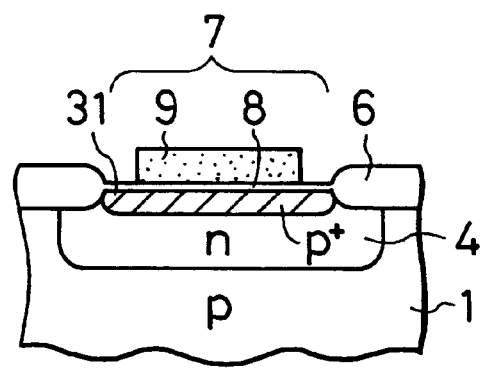
FIG. 10 is a partial, cross-sectional view along the line X—X in FIG. 9.
Figure 11:
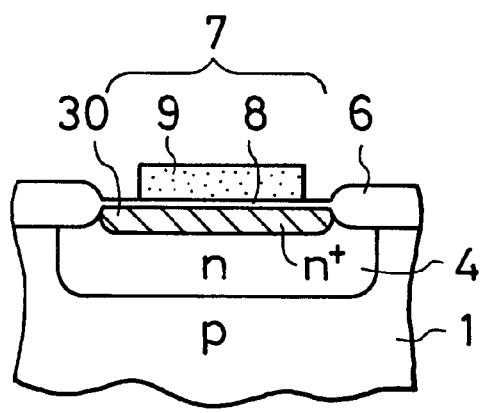
FIG. 11 is a partial, cross-sectional view along the line XI—XI in FIG. 9.

A semiconductor device according to a second embodiment is shown in FIGS. 9, 10, and 11.

As shown in FIGS. 9, 10, and 11, the semiconductor device according to the second embodiment has the same structure as that of the first embodiment except that an $n^+$-diffusion region 30 and a $p^+$-diffusion region 31 are formed instead of the $n^-$-diffusion region 17, the $p^-$-diffusion region 18, the $n^-$-diffusion region 23, and the $p^+$-diffusion region 24 in the first embodiment.

Therefore, the description relating to the same structure is omitted here by adding the same reference characters to the corresponding elements in FIGS. 9, 10, and 11 for the sake of simplification.

The $n^+$-type diffusion region 30, which is heavily doped with an n-type dopant, is formed in a half (a lower half in FIG. 9) of the n-type well 4. The $p^+$-type diffusion region 31, which is heavily doped with a p-type dopant, is formed in another half (an upper half in FIG. 9) of the well 4.

The regions 30 and 31 are located beneath not only the electrode 9 but also the square-ringed gap between the electrode 9 and the field oxide layer 6. Each of the regions 30 and 31 serves as a part of the first or second subcapacitor and as a contact for electric connection.

The reference numeral 32 indicates the boundary of the regions 30 and 31.

Figure 15:
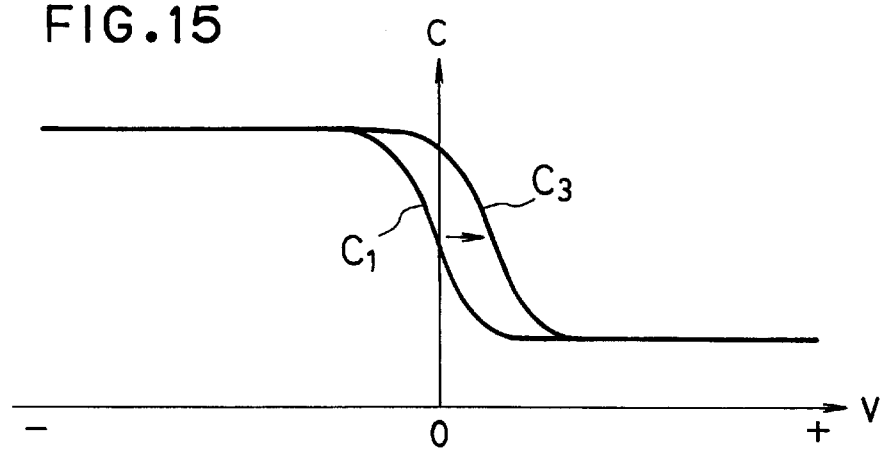
FIG. 15 is a graph showing the change of the voltage (V)-capacitance (C) characteristic of the first subcapacitor in the semiconductor device according to the second embodiment of FIGS. 9, 10, and 11 with respect to the dopant concentration of the first part.

In the semiconductor device according to the second embodiment, since the dopant concentration of the diffusion regions 30 and 31 is higher than that of the $n^-$ and $p^-$-type diffusion regions 17 and 18 in the first embodiment, there is an advantage that the total capacitor has a flatter V-C characteristic than that of the first embodiment, in other words, the voltage dependence of the total capacitance is lower than the first embodiment. The reason is as follows:

When the dopant concentration of the $p^-$-type diffusion region 18 is increased, the V-C characteristic of the first subcapacitor is changed from the curve $C_1$ to the curve $C_3$, as shown in FIG. 15. Specifically, the falling point of the curve $C_1$ is shifted to the right-hand side (i.e., the plus side of V).

Figure 16:
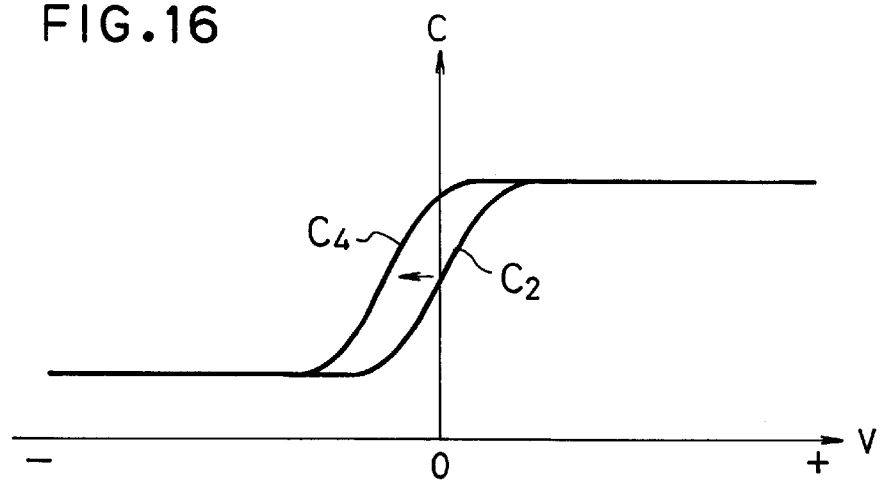
FIG. 16 is a graph showing the change of the voltage (V)-capacitance (C) characteristics of the second subcapacitor in the semiconductor device according to the second embodiment of FIGS. 9, 10, and 11 with respect to the dopant concentration of the second part.
Figure 17:
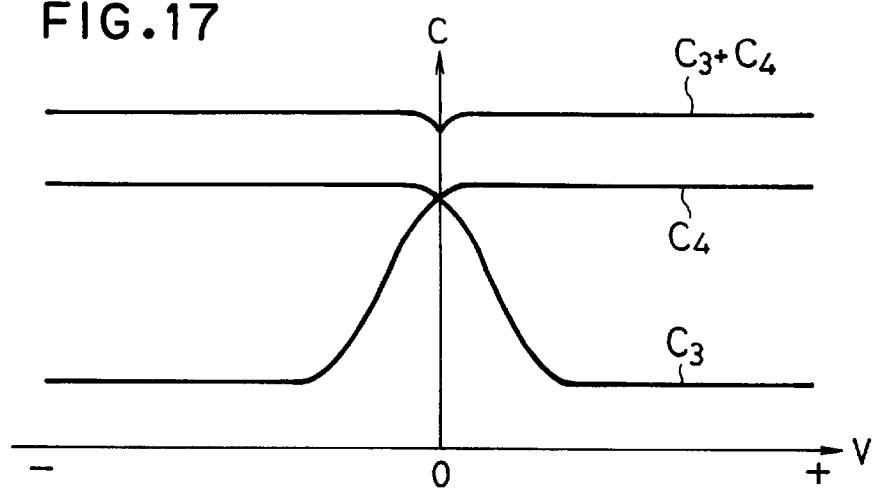
FIG. 17 is a graph showing the voltage (V)-capacitance (C) characteristics of the capacitor and its first and second subcapacitors in the semiconductor device according to the second embodiment of FIGS. 9, 10, and 11.

When the dopant concentration of the $n^-$-type diffusion region 17 is increased, the V-C characteristic of the second subcapacitor is changed from the curve $C_2$ to the curve $C_4$, as shown in FIG. 16. Specifically, the falling point of the curve $C_3$ is shifted to the left-hand side (i.e., the minus side of V).

Accordingly, when the dopant concentration of the $n^-$-type diffusion region 17 and the $p^-$-type diffusion region 18 is increased, the total capacitor has a substantially flat V-C characteristic as indicated by the curve $(C_3+C_4)$.

Next, a fabrication method of the semiconductor device according to the second embodiment is explained below with reference to FIGS. 12A to 12D, 13A to 13D, and 14A and 14D.

Figure 12A:
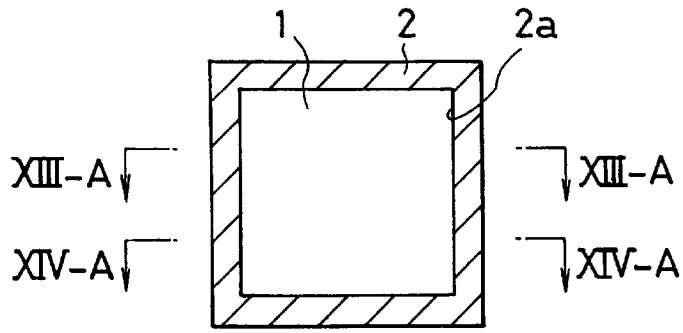
FIGS. 12A to 12D are partial, plan views of the semiconductor device, which show a fabrication method of the semiconductor device according to the second embodiment of FIGS. 9, 10, and 11, respectively.
Figure 13A:
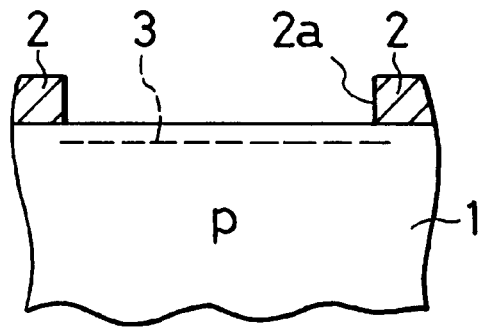
FIGS. 13A to 13D are partial, cross-sectional views along the lines XIII-A-XIII-A to XIII-D-XIII-D in FIG. 12A to 12D, which show the fabrication method of the semiconductor device according to the second embodiment of FIGS. 9, 10, and 11, respectively.
Figure 14A:
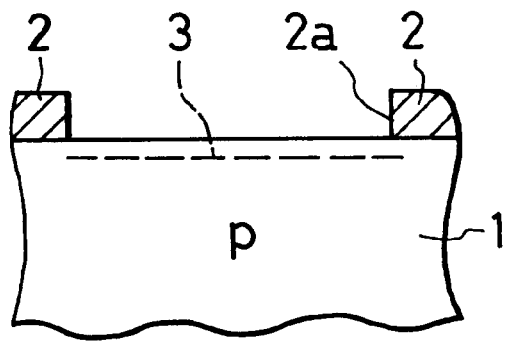
FIGS. 14A to 14D are partial, cross-sectional views along the lines XIV-A-XIV-A to XIV-D-XIV-D in FIG. 12A to 12D, which show the fabrication method of the semiconductor device according to the second embodiment of FIGS. 9, 10, and 11, respectively.

First, as shown in FIGS. 12A, 13A, and 14A, a patterned photoresist film 2 with a square window 2a is formed on the main surface of the p-type single-crystal silicon substrate 1. Next, using the photoresist film 2 as a mask, phosphorus (P) ions are selectively implanted into the substrate 1 through the window 2a of the film 2 with a dose of approximately $1\times10^{12}$ to $1\times10^{14}$ atoms/cm². The bottom of the ion-implanted region is indicated by the reference numeral 3 in FIGS. 13A and 14A.

Figure 12B:
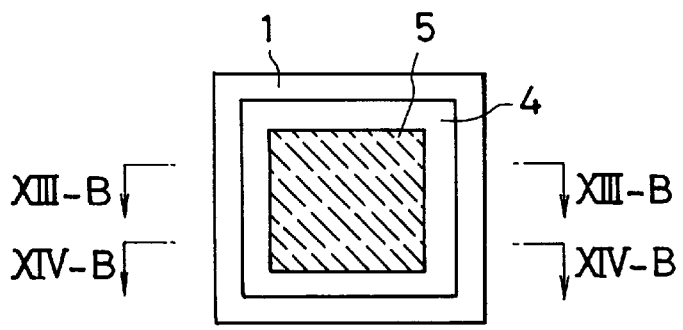
Figure 13B:
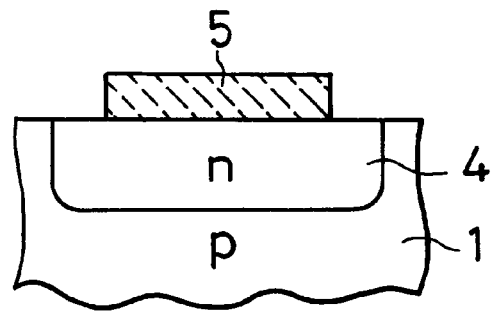
Figure 14B:
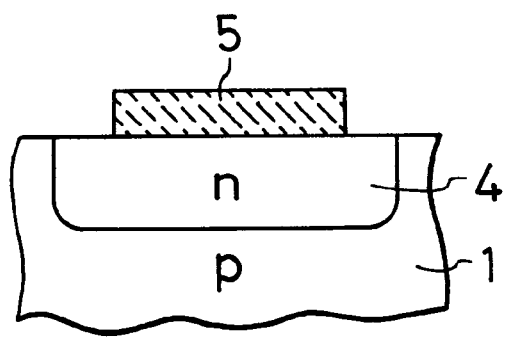

After the photoresist film 2 is stripped, the substrate 1 is subjected to a heat treatment at a temperature of 1000° C. or higher to diffuse the implanted phosphorus ions within the substrate 1, thereby forming the n-type well 4, as shown in FIGS. 12B, 13B, and 14B.

Then, a silicon nitride layer 5 with a thickness of approximately 50 to 1000 nm is grown on the well 4 by a CVD process or the like, and then, the layer 5 is patterned to be located on the well 4 by popular patterning processes, as shown in FIGS. 12B, 13B, and 14B. The silicon nitride layer 5 has a square plan shape smaller than the window 2a of the photoresist film 2, and is concentric with the well 4. The state at this stage is shown in FIGS. 12B, 13B, and 14B.

Figure 12C:
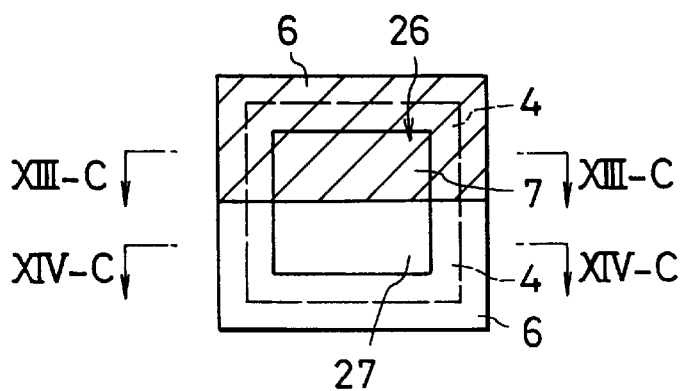
Figure 13C:
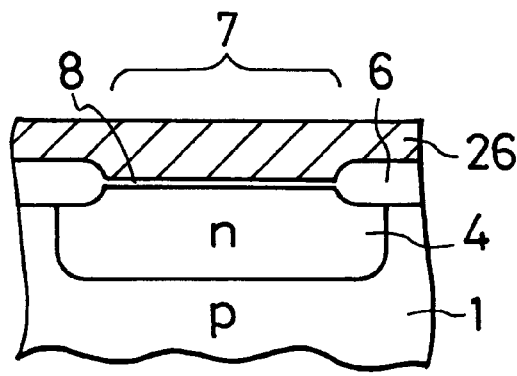
Figure 14C:
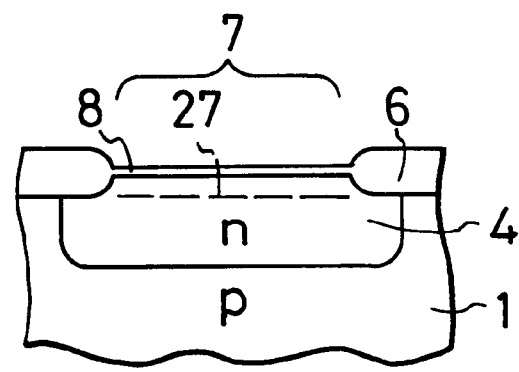

Using the patterned silicon nitride layer 5 as a mask, the substrate 1 is thermally oxidized at a temperature of 900° C. or higher, selectively growing a field oxide layer 6 at a location where the nitride layer 5 is removed. Thus, the square active area 7 is defined by the field oxide layer 6 on the n-type well 4, as shown in FIGS. 12C, 13C, and 14C. The whole active area 7 is positioned in the well 4. The periphery of the well 4 is located under the field oxide layer 6.

The above process steps are the same as those in the first embodiment.

After stripping the remaining silicon nitride layer 5, an insulating layer 8 with a thickness of approximately 1 to 100 nm is formed on the exposed surface of the well 4 or the active area 7, as shown in FIGS. 13C, and 14C by a popular process. This process is performed in a gate-oxide formation process for MOSFETs (not shown) provided on the substrate 1.

Subsequently, as shown in FIGS. 12C, 13C, and 14C, a patterned photoresist film 26 is formed on the insulating layer 8. The film 26 covers not only a half (an upper half in FIG. 12C) of the well 4 but also the field oxide layer 6. Using the photoresist film 26 as a mask, phosphorus (P) or arsenic (As) ions as an n-type dopant are selectively implanted into the well 4 with a dose of approximately $1\times10^{14}$ to $1\times10^{16}$ atoms/cm². The implanted region is indicated by the reference numeral 27 in FIG. 12C.

Figure 12D:
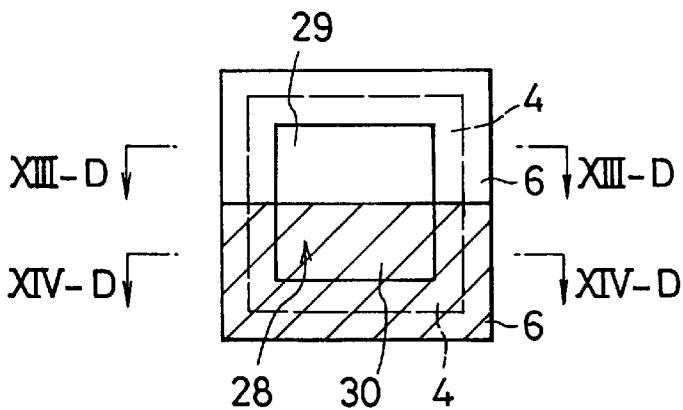
Figure 13D:
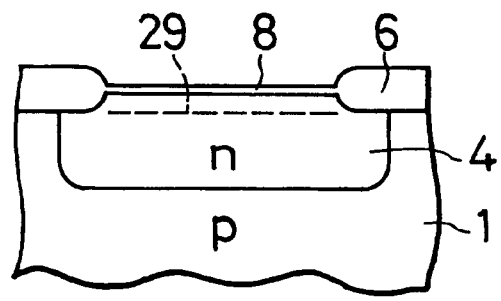
Figure 14D:
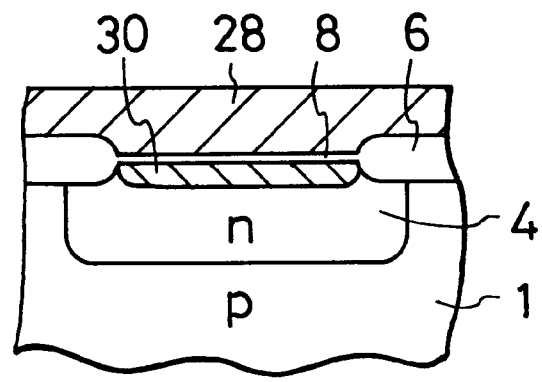

After stripping the photoresist film 26, a patterned photoresist film 28 is formed on the insulating layer 8, as shown in FIGS. 12D, 13D, and 14D. The film 28 covers not only another half (a lower half in FIG. 12D) of the well 4 but also the field oxide layer 6. Using the photoresist film 28 as a mask, boron (B) or boron fluoride ($BF_2$) ions as a p-type dopant are selectively implanted into the well 4 with a dose of approximately $1 \times 10^{14}$ to $1 \times 10^{16}$ atoms/$cm^2$. The implanted region is indicated by the reference numeral 29 in FIG. 12D.

Following this step, the substrate 1 is subjected to a heat treatment at a temperature of 800° C. or higher to activate the implanted ions within the well 4, thereby forming the $n^+$-type diffusion region 30 in a half of the surface area of the well 4 and the $p^+$-type diffusion region 31 in another half thereof, as shown in FIGS. 9, 10, and 11.

A conductive layer with a thickness of approximately 100 to 1000 nm is formed on the whole substrate 1 and then, is patterned to form an electrode 9 on the insulating layer 8. The insulating layer 8 is exposed from the electrode 9 through the gap, as shown in FIGS. 9, 10, and 11.

Through the above-described process steps, the MOS capacitor is formed on the substrate 1.

With the semiconductor device according to the second embodiment of FIGS. 9, 10, and 11, the surface area of the well 4 is divided into the $n^+$-type diffusion region 30 and the $p^+$-type diffusion region 31.

Since the conductivity type of the regions 30 and 31 are opposite to each other, the capacitance of the first subcapacitor increases and the capacitance of the second subcapacitor decreases with an increasing voltage applied across the capacitor.

As a result, the same advantages as those in the first embodiment described previously can be obtained in the semiconductor device according to the second embodiment.

In the above two embodiments, a p-type semiconductor substrate and an n-type well are used. However, it is needless to say that an n-type semiconductor substrate and a p-type well may be used. Also, the values about film thickness, or the like disclosed in the above embodiments are examples and therefore, any other values may be properly determined.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor device comprising:
   (a) a semiconductor substrate of a first conductivity type;
   (b) a well formed in said substrate, said well being of a second conductivity type opposite to said first conductivity type;
      a surface area of said well being divided into at least first and second parts;
      said first part being of said first conductivity type and said second part being of said second conductivity type;
   (c) an insulating layer formed on said well to be contacted with said first and second parts; and
   (d) an electrode formed on said insulating layer to be located over said first and second parts;
      wherein said first and second parts of said well, said insulating layer, and said electrode constitute a capacitor.

2. A device as claimed in claim 1, wherein a dopant concentration of said first and second parts of said well is higher than that of the remaining well.

3. A device as claimed in claim 2, wherein the dopant concentration of said first and second parts of said well is lower than that of the remaining well.

4. A device as claimed in claim 3, wherein the surface area of said well further includes a third part of said first conductivity type and a fourth part of said second conductivity type for electrical connection to said well.

5. A device as claimed in claim 1, wherein said first and second parts of said well have a same plan size.

6. A device as claimed in claim 1, wherein said capacitor comprises:
   a first subcapacitor constituted by said first part of said well, said insulating layer, and said electrode; and
   a second subcapacitor constituted by said second part of said well, said insulating layer, and said electrode.

7. A semiconductor device comprising:
   (a) a semiconductor substrate of a first conductivity type;
   (b) a well formed in said substrate, said well being of a second conductivity type opposite to said first conductivity type;
      a surface area of said well being divided into at least first and second parts;
      said first part being of said first conductivity type and said second part being of said second conductivity type;
   (c) an insulating layer formed on said well to be contacted with said first and second parts; and
   (d) an electrode formed on said insulating layer to be located over said first and second parts;
      wherein said well, said insulating layer, and said electrode constitute a capacitor; and
      said first and second parts of said well have a same plan size.

8. A device as claimed in claim 7, wherein a dopant concentration of said first and second parts of said well is higher than that of the remaining well.

9. A device as claimed in claim 7, wherein a dopant concentration of said first and second parts of said well is lower than that of the remaining well.

10. A device as claimed in claim 9, wherein the surface area of said well further includes a third part of said first conductivity type and a fourth part of said second conductivity type for electrical connection to said well.

11. A device as claimed in claim 7, wherein said capacitor comprises:
   a first subcapacitor constituted by said first part of said well, said insulating layer, and said electrode; and
   a second subcapacitor constituted by said second part of said well, said insulating layer, and said electrode.

* * * * *